(12) United States Patent
Kim et al.

(10) Patent No.: US 12,347,365 B2
(45) Date of Patent: Jul. 1, 2025

(54) PIXEL CIRCUIT, DISPLAY DEVICE USING THE SAME AND MANUFACTURING METHOD THEREOF

(71) Applicant: INDUSTRY-UNIVERSITY COOPERATION FOUNDATION HANYANG UNIVERSITY ERICA CAMPUS, Ansan-si (KR)

(72) Inventors: Younghyun Kim, Seoul (KR); Taehyeon Noh, Yongin-si (KR); Seoungmin Park, Busan (KR); Taewon Jin, Uijeongbu-si (KR)

(73) Assignee: INDUSTRY-UNIVERSITY COOPERATION FOUNDATION HANYANG UNIVERSITY ERICA CAMPUS, Ansan-Si (KR)

( * ) Notice: Subject to any disclaimer, the term of this patent is extended or adjusted under 35 U.S.C. 154(b) by 0 days.

(21) Appl. No.: 18/518,657

(22) Filed: Nov. 24, 2023

(65) Prior Publication Data

US 2024/0177654 A1 May 30, 2024

(30) Foreign Application Priority Data

Nov. 24, 2022 (KR) .................. 10-2022-0159364
Nov. 23, 2023 (KR) .................. 10-2023-0164361

(51) Int. Cl.
*G09G 3/32* (2016.01)
*H10H 29/14* (2025.01)

(52) U.S. Cl.
CPC ............. *G09G 3/32* (2013.01); *H10H 29/142* (2025.01); *G09G 2300/0426* (2013.01);
(Continued)

(58) Field of Classification Search
CPC ... G09G 2300/0426; G09G 2300/0465; G09G 2300/0842; G09G 2320/0233;
(Continued)

(56) References Cited

U.S. PATENT DOCUMENTS 6,072,454 A * 6/2000 Nakai .................. G09G 3/2011
345/97
9,207,479 B2 * 12/2015 Kim ....................... G02F 1/1362
(Continued)

FOREIGN PATENT DOCUMENTS

JP 2002-169181 A 6/2002
KR 10-2003-0062508 A 7/2003
(Continued)

*Primary Examiner* — Kenneth Bukowski
(74) *Attorney, Agent, or Firm* — Finch & Maloney PLLC (57) ABSTRACT

The present invention relates to a pixel circuit, a display device using the same, and a method of manufacturing the same. A pixel circuit according to the present technology is a pixel circuit including a light-emitting diode and can include a light-emitting diode, the pixel circuit including a switching transistor connected to a node at which a scan line and a signal line intersect each other, a driving transistor which receives a data voltage in the signal line through the switching transistor and converts the data voltage to a current to be supplied to the light-emitting diode, and a storage capacitor which maintains a voltage applied by the switching transistor, wherein at least one of the driving transistor and the storage capacitor includes a layer formed of a ferroelectric. The present technology can provide a pixel circuit using a programmable driving TFT or programmable storage capacitor using a ferroelectric instead of a compensation circuit for compensating a critical voltage of the conventional current drive-based display circuit.

16 Claims, 12 Drawing Sheets

(52) U.S. Cl.
CPC ........... *G09G 2300/0465* (2013.01); *G09G 2300/0842* (2013.01); *G09G 2320/0233* (2013.01); *G09G 2320/045* (2013.01)

(58) Field of Classification Search
CPC .. G09G 2320/045; G09G 3/32; G09G 3/3233; H10H 29/142; H10H 25/0753; H10H 25/167
See application file for complete search history.

(56) References Cited

U.S. PATENT DOCUMENTS

| | | |
|---|---|---|
| 10,366,656 B2 | 7/2019 | Jeon et al. |
| 11,308,874 B2 | 4/2022 | Kim et al. |
| 2011/0012889 A1* | 1/2011 | Miyamoto ............. G09G 3/344 345/212 |
| 2017/0337875 A1* | 11/2017 | Jeon ..................... G09G 3/3233 |
| 2018/0277039 A1* | 9/2018 | Zhang .................. G09G 3/3233 |
| 2019/0392758 A1* | 12/2019 | Kim ..................... G09G 3/3233 |
| 2020/0194557 A1* | 6/2020 | Zhu ..................... H01L 29/1606 |
| 2022/0130330 A1* | 4/2022 | Zhu ........................ H10K 59/38 |
| 2023/0087472 A1* | 3/2023 | Xu ........................... G09G 3/32 345/691 |
| 2023/0099443 A1* | 3/2023 | Liu ........................ H10B 53/30 257/295 |
| 2024/0304159 A1* | 9/2024 | Liao ..................... G09G 3/3677 |

FOREIGN PATENT DOCUMENTS

| | | |
|---|---|---|
| KR | 10-2013-0005024 A | 1/2013 |
| KR | 10-2017-0132016 A | 12/2017 |
| KR | 10-2020-0003430 A | 1/2020 |

\* cited by examiner

PIXEL CIRCUIT, DISPLAY DEVICE USING THE SAME AND MANUFACTURING METHOD THEREOF

CROSS-REFERENCE TO RELATED APPLICATION

This application claims the benefit of Republic of Korea Patent Application 10-2022-0159364 (filed 24 Nov. 2022) and Republic of Korea Patent Application 10-2023-0164361 (filed 23 Nov. 2023). The entire disclosure of both of these priority applications is hereby incorporated by reference herein.

BACKGROUND

1. Field of the Invention

The present invention relates to a pixel circuit, a display device using the same, and a method of manufacturing the same, and more specifically, to a pixel circuit using a ferroelectric, a display device using the same, and a method of manufacturing the same.

2. Discussion of Related Art

Thin film transistors (TFTs) are being used in various fields and used as switching and driving elements in flat display devices such as liquid crystal displays (LCDs) and organic light emitting diode (OLED) displays.

An active-matrix OLED (AMOLED) display includes a TFT array in a panel. The AMOLED display includes at least two TFTs in a pixel for displaying red, green, blue, or white. The TFTs each include a switching transistor which controls the operation of each pixel and a driving transistor which drives an OLED.

Meanwhile, when the uniformity of a characteristic of the driving transistor is degraded in the panel of the AMOLED display, random mura increases in the panel, and mura is displayed along an excimer laser annealing (ELA) line depending on a manufacturing process, thereby degrading image quality.

In order to solve this problem, in the conventional active-matrix display devices, various compensation circuits are applied to each pixel circuit to compensate a critical voltage of a driving transistor as a method of reducing non-uniformity of a TFT panel caused by ELA. Improvement of image quality of the active-matrix display device is attempted through these methods.

However, when the above-described conventional technology is used, there are problems that complex pixels are formed, an aperture ratio decreases, and a yield decreases due to the complex pixel structure. This decreases the efficiency of a current drive-based display circuit.

SUMMARY OF THE INVENTION

The present invention is directed to providing a pixel circuit using a programmable driving thin film transistor (TFT) using a ferroelectric and/or a programmable storage capacitor instead of a compensation circuit for compensating a critical voltage of the conventional current drive-based display circuit.

Meanwhile, other objectives which are not described above will be further considered in a range that can be easily inferred from the detailed description and effects thereof.

According to an aspect of the present invention, there is provided a pixel circuit including a light-emitting diode, the pixel circuit including a switching transistor connected to a node at which a scan line and a signal line intersect each other, a driving transistor which receives a data voltage in the signal line through the switching transistor and converts the data voltage to a current to be supplied to the light-emitting diode, and a storage capacitor which maintains a voltage applied by the switching transistor, wherein at least one of the driving transistor and the storage capacitor includes a layer formed of a ferroelectric.

The ferroelectric may be hafnium-zirconium oxide.

The driving transistor may be a single gate transistor.

The driving transistor may be a double gate transistor.

A source of the switching transistor may be connected to the signal line, a gate of the switching transistor may be connected to the scan line, and a drain of the switching transistor and one end of the storage capacitor may be connected to a gate of the driving transistor.

The other end of the storage capacitor may be connected to a ground source.

In addition, according to another aspect of the present invention, there is provided a display device including a pixel circuit including a light-emitting diode, wherein the pixel circuit includes a switching transistor connected to a node at which a scan line and a signal line intersect each other, a driving transistor which receives a data voltage in the signal line through the switching transistor and converts the data voltage to a current to be supplied to the light-emitting diode, and a storage capacitor which maintains a voltage applied by the switching transistor, and at least one of the driving transistor and the storage capacitor includes a layer formed of a ferroelectric.

In addition, according to still another aspect of the present invention, there is provided a method of manufacturing a display device, the method including preparing a substrate, forming a first thin film transistor (TFT), a second TFT, and a storage electrode on the substrate, forming a metal bus on the second TFT and the storage electrode, dividing the metal bus to form a first metal bus and a second metal bus, forming a ferroelectric layer on the second metal bus to form a storage capacitor in which the storage electrode serves as one electrode and the ferroelectric layer serves as a dielectric material layer, and forming a light-emitting element including a light-emitting layer on the first metal bus.

The ferroelectric layer of the storage capacitor may be disposed above the first TFT and the second TFT.

The second TFT may be a single gate transistor.

The second TFT may be a double gate transistor.

Each operation of the method of manufacturing the display device may be performed by known thin film forming processes such as a deposition process for a corresponding material, a patterning process through photolithography and etching processes, and a contact hole process for exposing a part of an electrode.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

The accompanying drawings are illustrated for reference for understanding the technical spirit of the present invention and do not limit the scope of the present invention.

DETAILED DESCRIPTION OF EXEMPLARY EMBODIMENTS

The above-described objectives, other objectives, features, and advantages of the present invention will be easily understood from the following exemplary embodiments related to the accompanying drawings. However, the technical spirit of the present invention is not limited to the embodiments which will be described herein and may be realized in different forms. Further, the embodiments introduced herein are provided with the intention of providing convenience of understanding so that the disclosed content is thorough and complete and the spirit of the present invention is sufficiently conveyed to those skilled in the art, with no other intention.

In the present specification, when a certain element or line is described as being connected to a target element block, it means not only a case in which the certain element is directly connected to the target element block, but also a case in which the certain element is indirectly connected to the target element block element through another certain element.

In addition, the same or similar elements may be denoted by the same or similar reference numerals in the drawings. In some drawings, relationships between elements and lines are illustrated only to effectively describe the technical content, and other elements and circuit blocks may be further included.

Each embodiment described and illustrated herein may also include a complementary embodiment thereof, and a general operation of a display device and a circuit or element for performing such a general operation will not be described in detail so as not to obscure the gist of the present invention.

Figure 1:
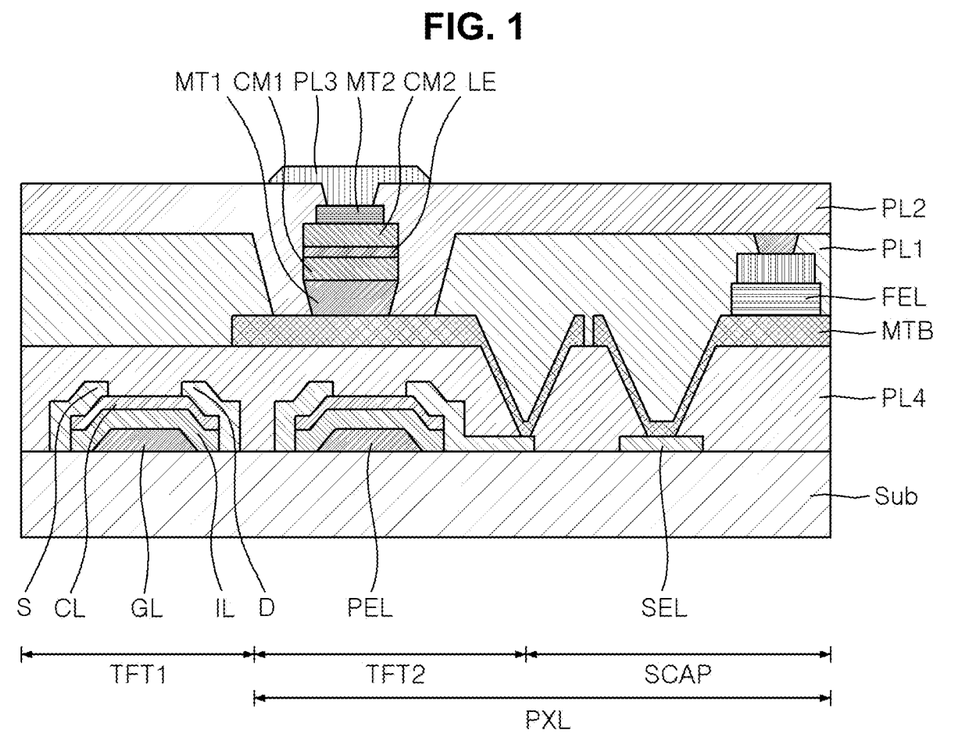
FIG. 1 is a cross-sectional view illustrating one cell of a current drive-based display device using a pixel circuit according to one embodiment of the present invention.
Figure 2:
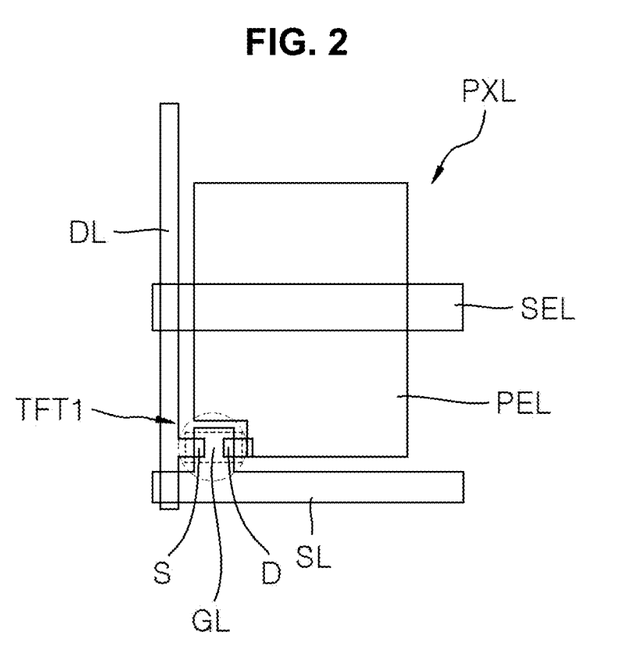
FIG. 2 is a plan view illustrating a thin film transistor (TFT) substrate of FIG. 1.
Figure 3:
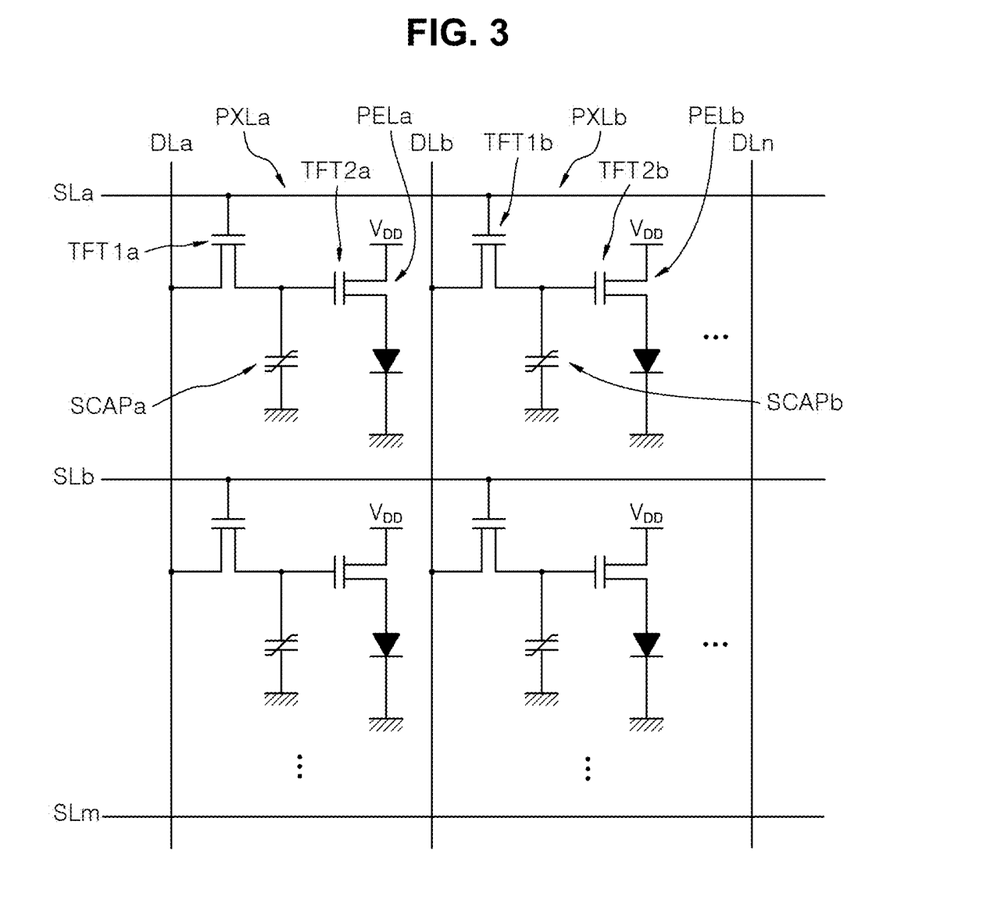
FIG. 3 is a view illustrating an equivalent circuit diagram of the TFT substrate in FIG. 2.

FIG. 1 is a cross-sectional view illustrating one cell of a current drive-based display device using a pixel circuit according to one embodiment of the present invention. FIG. 2 is a plan view illustrating a thin film transistor (TFT) substrate of FIG. 1, and FIG. 3 is a view illustrating an equivalent circuit diagram of the TFT substrate in FIG. 2.

As illustrated in the drawings, a plurality of scan lines SLa to SLm extend in a row direction, and a plurality of signal lines DLa to DLn extend in a column direction. Pixels PXLa to PXLx are disposed at intersections in a matrix.

In the pixels PXLa to PXLx, first TFTs TFT1a to TFT1x serving as switching elements are connected between pixel electrodes PELa to PELx, the scan lines SLa to SLm, and the signal lines DLa to DLn. In addition, second TFTs TFT2a to TFT2x serving as driving elements are connected to the pixel electrodes PELa to PELx. In addition, storage capacitors SCAPa to SCAPx serving as capacitive elements are connected between the pixel electrodes PELa to PELx and storage electrodes SELa to SELx. In the drawings, for the sake of convenience of description, it is illustrated that the storage electrode is a ground, but the present invention is not limited thereto.

As in FIG. 1, the first TFT TFT1 is formed in a reverse stagger structure in which a gate electrode GL is formed on a substrate SUB such as a glass, a gate insulating layer IL formed of, for example, a silicon nitride film, a silicon oxide film, or a tantalum oxide film is formed on the gate electrode GL, and a channel layer CL using an oxide semiconductor is formed on the gate insulating layer IL corresponding to the gate electrode GL in an island type. In addition, a source electrode S and a drain electrode D are connected to both sides of the channel layer CL, the drain electrode D is connected to a pixel electrode PEL formed in a pixel region PXL, and the pixel electrode PEL serves as one electrode of a storage capacitor SCAP.

The second TFT TFT2 formed in the pixel region PXL may have substantially the same structure as the first TFT TFT1. That is, the second TFT TFT2 may have a gate electrode, a gate insulating layer, a channel layer, and source/drain electrodes sequentially stacked on the substrate. In addition, these may be formed of the same materials as corresponding elements of the first TFT TFT1. However, there is a difference in that the drain electrode of the second TFT is connected to a first metal layer MT1 through a metal bus MTB connecting a light-emitting element and a driving element, and the first metal layer MT1 serves as one electrode of the light-emitting element.

In the light-emitting element formed in the pixel region PXL, the first metal layer MT1 for applying a voltage to the light-emitting element, a first transfer layer CM1 through which electrons/holes entered from the first metal MT1 move, a light-emitting layer LE in which the electrons/holes are recombined to emit light, a second transfer layer CM2 through which the electrons/holes entered from the light-emitting layer LE move, and a second metal layer MT2 which is for applying a voltage to the light-emitting element and is formed of a transparent material are sequentially formed as in FIG. 1. In FIG. 1, reference symbols PL1, PL2, and PL3 denote passivation films for preventing the degradation of the elements.

In addition, a storage electrode SEL for forming the storage capacitor SCAP is formed on the substrate SUB and formed of the same metal film material as the drain electrode D.

In the storage capacitor SCAP, a ferroelectric layer FEL formed of, for example, hafnium-zirconium oxide (HZO), is formed on the metal bus MTB formed of at least one among Al, an alloy film of Al and a heat-resistant conductive material, Pt, Ti, Ta, W, Mo, Cr, and Nd. Although any ferroelectric material having a hysteresis characteristic due to residual polarization may be applied as the ferroelectric layer FEL, HZO is proper as a complementary metal-oxide-semiconductor (CMOS)—friendly material unlike the conventional ferroelectric, and a manufacturing cost of the current drive-based display circuit is expected to be less expensive compared to the conventional method. A reference symbol PL4 in FIG. 1, denotes a passivation film for preventing the degradation of the element.

Meanwhile, it should be noted that the metal bus MTB (on the left side of FIG. 1) for connecting the driving element and the light-emitting element and a metal bus MTB (on the right side of FIG. 1) for connecting the storage electrode and the ferroelectric layer are formed of the same material and electrically disconnected from each other.

A ferroelectric is a material which has a spontaneous electric polarization and of which an orientation of the spontaneous electric polarization is reversely changed by an electric field, and a dielectric property in this case is a ferroelectric property. In the ferroelectric material, while an electric polarization is zero or has a small value in a state in which there is no electric field, when an electric field increases, a spontaneous polarization is reversely changed, and thus a hysteresis or saturation phenomenon similar to a magnetization curve occurs. Accordingly, various conventional compensation circuits can be replaced with a ferroelectric. That is, this is because, in the conventional compensation circuit, while a critical voltage of a driving transistor is compensated in each pixel circuit, the polarization of the ferroelectric which is programmable according to an application extent of an external voltage can be used to compensate a critical voltage. The programmability of the ferroelectric is an effect obtained due to a difference between coercive fields of a polycrystalline ferroelectric in domains.

Accordingly, as described above, the ferroelectric layer is used in the storage capacitor SCAP, the conventional compensation circuit can be removed, and the unit performance of the display circuit can be improved. The storage capacitor SCAP including the ferroelectric layer FEL is an element in which an extent of polarization is adjustable by a programmed signal and which is capable of adjusting a current flowing through a driving TFT and a brightness of light of a light-emitting diode generated due to the current. In this case, the polarization adjustment may be performed by a switching TFT TFT1, and use of the capacitive element SCAP separately manufactured from a driving TFT TFT2 in a driving process is expected to be advantageous in terms of superior retention time.

Figure 4:
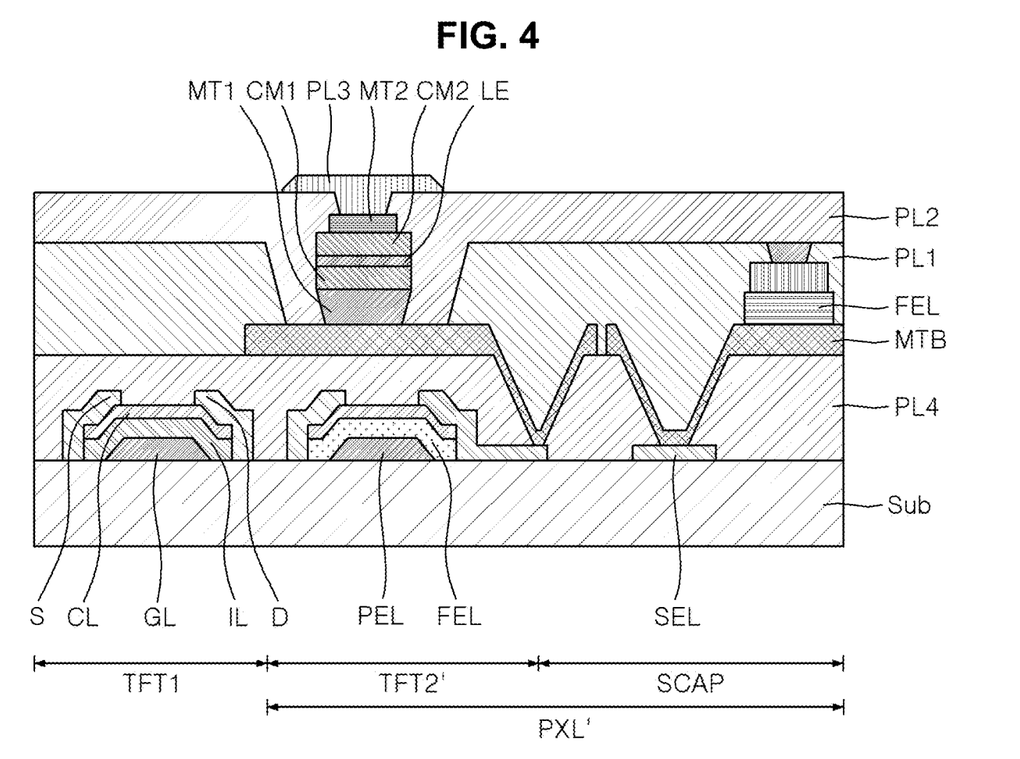
FIG. 4 is a cross-sectional view illustrating one cell of a current drive-based display device using a pixel circuit according to another embodiment.
Figure 5:
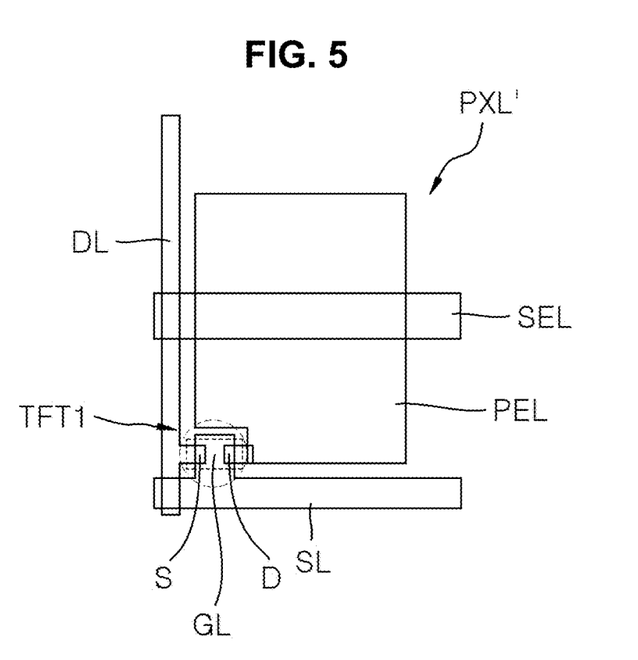
FIG. 5 is a plan view illustrating a TFT substrate of FIG. 4.
Figure 6:
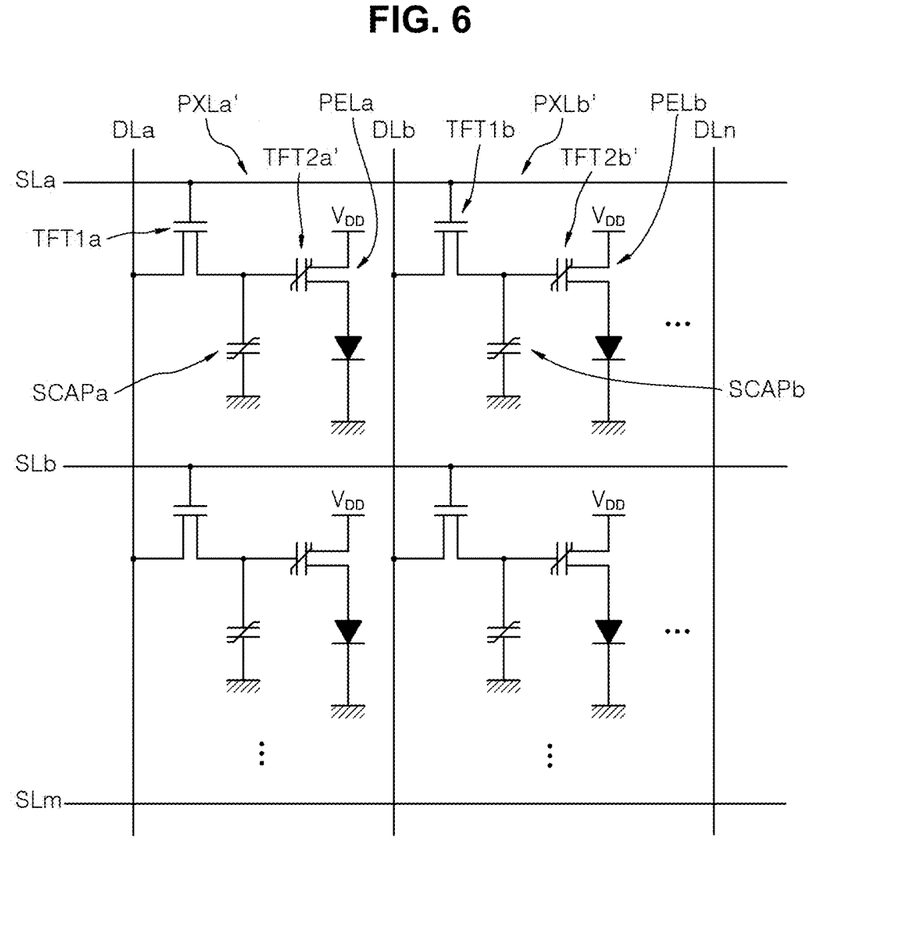
FIG. 6 is a view illustrating an equivalent circuit diagram of the TFT substrate in FIG. 5.

FIG. 4 is a cross-sectional view illustrating one cell of a current drive-based display device using a pixel circuit according to another embodiment. FIG. 5 is a plan view illustrating a TFT substrate of FIG. 4, and FIG. 6 is a view illustrating an equivalent circuit diagram of the TFT substrate in FIG. 5. Different from the content described with reference to FIGS. 1 to 3 will be mainly described, and the same content as FIGS. 1 to 3 may be applied elsewhere.

Instead of the second TFTs TFT2a to TFT2x in FIGS. 1 to 3, in FIGS. 4 to 6, second ferroelectric transistors TFT2a' to TFT2x' serving as driving elements are connected to pixel electrodes PELa to PELx. For this meaning, a prime symbol (') is added to a reference symbol for reference.

The second ferroelectric transistor TFT2' formed in a pixel region PXL' may have substantially the same structure as the second TFT TFT2. However, the second ferroelectric transistor is different in that the second ferroelectric transistor has a ferroelectric layer FEL corresponding to a gate insulating layer of the second TFT. The ferroelectric layer FEL may be formed of the same material as the ferroelectric layer FEL of the storage capacitor SCAP in FIG. 1 to 3. In this case, the ferroelectric layer FEL (on the left side of FIG. 4) of the second ferroelectric transistor and a ferroelectric layer FEL (on the right side of FIG. 4) of a storage capacitor are formed of the same material but may be preferably formed through different processes in time. That is, according to a stacking sequence illustrated in the drawings, the ferroelectric layer FEL (on the left side of FIG. 4) of the second ferroelectric transistor may be preferably formed first, and then the ferroelectric layer FEL (on the right side of FIG. 4) of the storage capacitor may be formed.

Unlike FIGS. 1 to 3 in which only the ferroelectric is used in the storage capacitor, in a pixel circuit of FIGS. 4 to 6, a ferroelectric is used in an insulating layer of both the storage capacitor and the driving TFT to adjust a critical voltage. Both the storage capacitor and the driving TFT are programmed by a programmed signal from a switching TFT. This has an effect of having two storage capacitors connected in series so that a memory window with a wider region can be expected.

Meanwhile, when the pixel circuit (referred to as a first embodiment) illustrated in FIGS. 1 to 3 and the pixel circuit (referred to as a second embodiment) illustrated in FIGS. 4 to 6 are compared, the first embodiment in which the ferroelectric is formed in only the storage capacitor is relatively advantageous in terms of a process. This is because the conventional process of forming a switching TFT and a driving TFT is used without change and a process of forming the ferroelectric layer of the storage capacitor on the substrate on which the switching TFT and the driving TFT are formed is simply added thereto. For example, as illustrated in FIG. 1, the switching TFT and the driving TFT may be formed through a conventional thin film process, the ferroelectric layer of the storage capacitor may be formed, and then the light-emitting element may be formed. In short, a process of forming the ferroelectric layer of the storage capacitor (called a metal-ferroelectric-metal (MFM) process) may be simply inserted between the processes of forming the switching TFT, the driving TFT, and the light-emitting element. The compensation circuit can be replaced simply by forming the ferroelectric layer of the storage capacitor on the switching TFT and the driving TFT.

In the case of the second embodiment, since the ferroelectric layer should be formed as the insulating layer of the driving TFT in the process of forming the driving TFT unlike the first embodiment, a relatively complex process is performed when compared to the first embodiment. As illustrated in FIG. 4, this is because a gate insulating layer of the switching TFT and the ferroelectric layer of the driving TFT which are arranged on the same layer should be formed of different materials, and to this end, formed in different processes in time. However, in the second embodiment, even though the process advantage of the first embodiment is reduced to some extent, a memory window with a wider area can be expected as described above.

Figure 7:
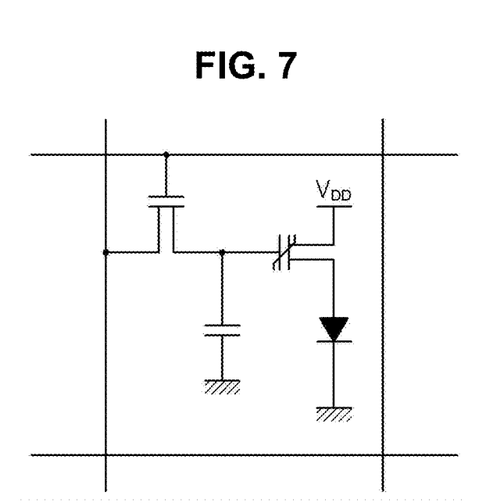
FIG. 7 is a view illustrating an equivalent circuit diagram of a pixel circuit according to still another embodiment.

Unlike FIGS. 1 to 6, an embodiment in which a ferroelectric is used in an insulating layer of a driving TFT is possible. A case in which a general insulating layer is used instead of the ferroelectric layer FEL on the right side of FIG. 4 may be considered. Referring to FIG. 7, an example of a circuit which adjusts a critical voltage using a ferroelectric as an insulating layer of a driving TFT is illustrated. A predetermined voltage may be applied to a storage capacitor by a signal applied from a switching TFT, the driving TFT may be programmed, and a driving voltage $V_{DD}$ may be applied to the driving TFT.

Figure 8:
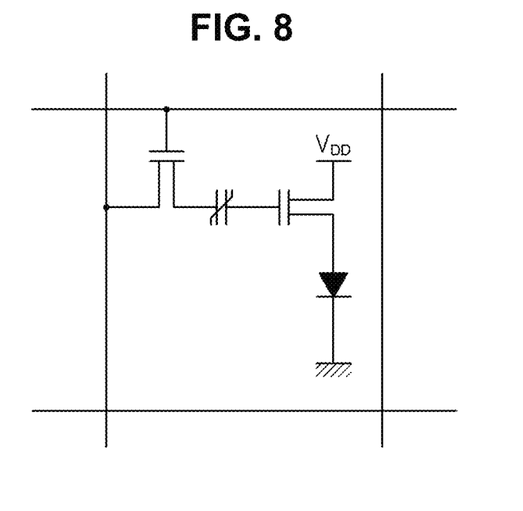
FIG. 8 is a view illustrating an equivalent circuit diagram of a pixel circuit according to yet another embodiment.

An embodiment in which a ferroelectric is used in a storage capacitor like in FIGS. 1 to 3 and both ends of the storage capacitor are connected between a drain electrode of a switching TFT and a pixel electrode is illustrated in FIG. 8. As illustrated in FIG. 8, the ferroelectric may be used in the storage capacitor to adjust a critical voltage. A polarization of the storage capacitor using the ferroelectric may be adjusted by a programmed signal, thereby adjusting a current flowing through a driving TFT and a brightness of light of a light-emitting diode generated due to the current can be adjusted. The polarization can be adjusted through the switching TFT, and the storage capacitor is expected to be programmed using an element such as the driving TFT without a separate element even in a process of driving the TFT.

As illustrated in FIGS. 7 and 8, a basic type of a pixel circuit according to one embodiment of the present invention may be a two transistor-one capacitor (2T-1C) in which a driving TFT, a switching TFT, and an information storage capacitor are formed. Among them, when the capacitor or the driving TFT is replaced with a ferroelectric, a threshold voltage of the driving TFT can be compensated using a threshold voltage adjustment property of the ferroelectric without a complex structure.

Hereinafter, an example in which a three transistor-one capacitor (3T-1C) or three transistor-zero capacitor (3T-0C) is implemented will be described.

Figure 9:
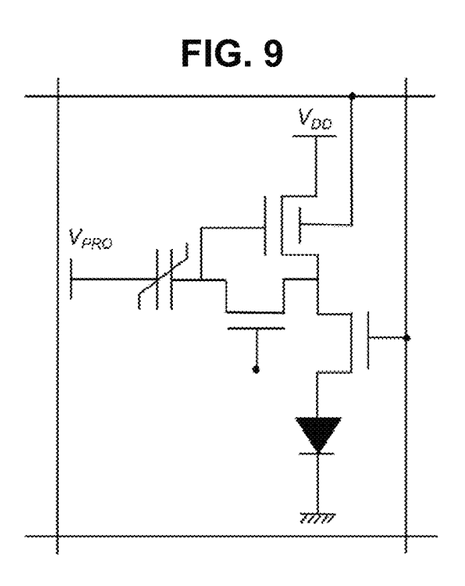
FIG. 9 is a plan view illustrating a current drive-based display circuit in which a ferroelectric is used in a double gate driving TFT according to one embodiment of the present invention.

FIG. 9 is a plan view illustrating a current drive-based display circuit in which a ferroelectric is used in a double gate driving TFT according to one embodiment of the present invention. The current drive-based display circuit corresponds to a 3T-1C structure.

Figure 10:
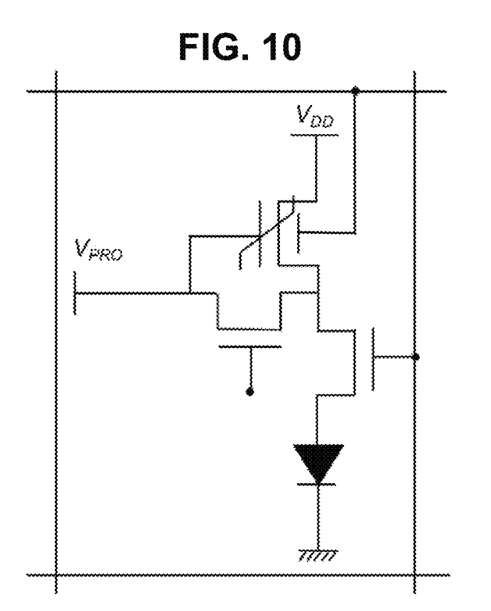
FIG. 10 is a plan view illustrating a display circuit in which a ferroelectric storage capacitor is used in a gate part of a double gate driving TFT according to one embodiment of the present invention.

FIG. 10 is a plan view illustrating a display circuit in which a ferroelectric storage capacitor is used in a gate part of a double gate driving TFT according to one embodiment of the present invention. The display circuit corresponds to a 3T-0C structure.

In the conventional compensation circuit, a compensating operation of a threshold voltage of a driving TFT is included in a driving operation of a pixel circuit. As illustrated in FIGS. 9 and 10, when a driving TFT is formed of a double gate, since a compensating operation may be separated from a driving operation, a higher scan rate can be expected. A driving voltage $V_{DD}$ may be applied to the second TFT TFT2 and a programming voltage $V_{PRO}$ may be applied to the storage capacitor or the first node N1.

Figure 11:
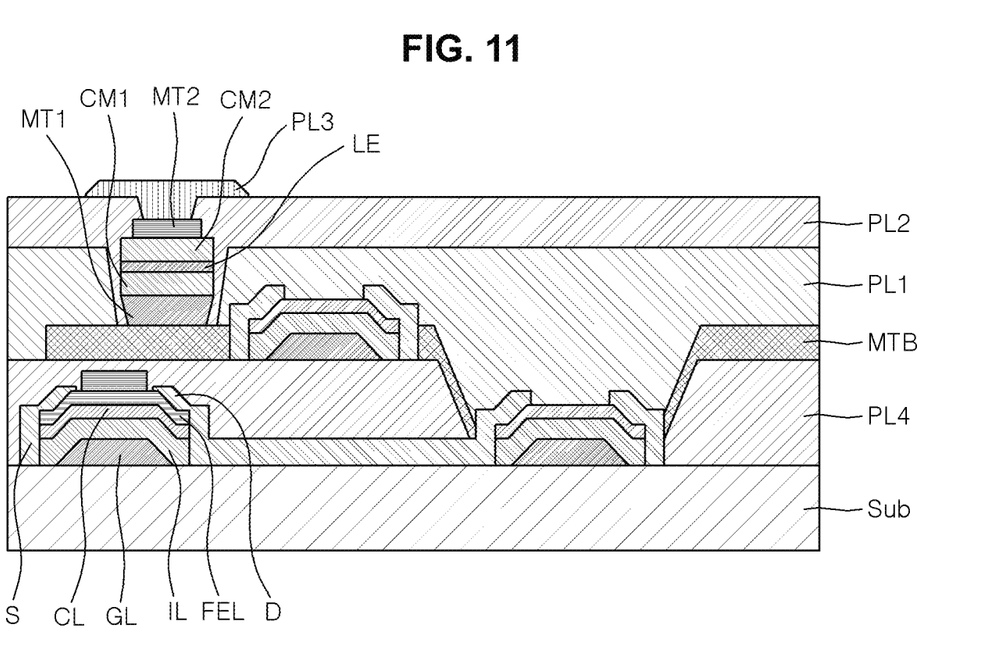
FIG. 11 is a configuration view illustrating a current drive-based display in which a ferroelectric is used as an insulating layer of a double driving TFT and an internal circuit according to one embodiment of the present invention.

FIG. 11 is a configuration view illustrating a current drive-based display in which a ferroelectric is used as an insulating layer of a double driving TFT and an internal circuit according to one embodiment of the present invention. As illustrated in the drawing, an internal compensation circuit of a 3T-0C in which a compensation terminal and a driving terminal are separated may be formed using a double gate as a driving TFT.

Figure 12:
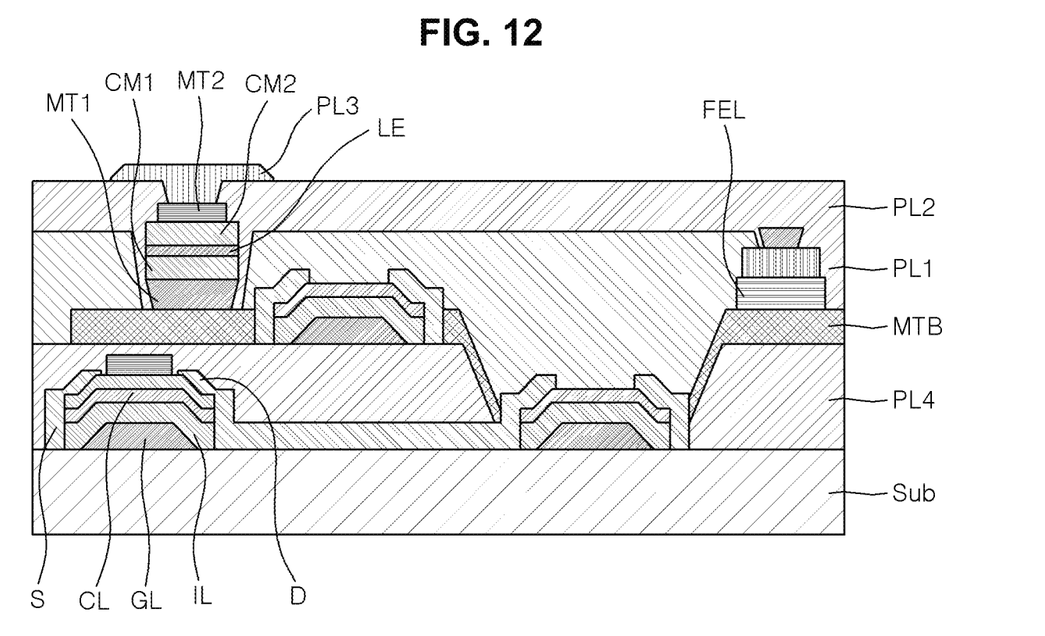
FIG. 12 is a configuration view illustrating a current drive-based display in which a ferroelectric is used as a storage capacitor of a gate terminal of a double driving TFT and an internal circuit according to one embodiment of the present invention.

FIG. 12 is a configuration view illustrating a current drive-based display in which a ferroelectric is used as a storage capacitor of a gate terminal of a double driving TFT and an internal circuit according to one embodiment of the present invention. As illustrated in the drawing, an internal compensation circuit of a 3T-1C in which a compensation terminal and a driving terminal are separated may be formed using a double gate as a driving TFT.

Reference symbols used in FIGS. 11 and 12 may be the same as those used in FIGS. 1 and 4.

According to one embodiment described above, instead of the conventional compensation circuit for compensating a critical voltage of a current drive-based display circuit, a programmable driving TFT and/or a programmable storage capacitor using HZO as a ferroelectric is used. Accordingly, even without an additional compensation circuit, a mura phenomenon of a display, in which a brightness of a display is non-uniformly changed due to a change in critical voltage of an internal TFT caused by a large-area process and a degradation phenomenon, can be solved, and thereby high resolution and high integration can be expected. Accordingly, as a large size of a compensation circuit is reduced into a size of a unit element, an aperture ratio increases, and thus resolution/transparency can be improved, and integration can be easy.

As a pixel circuit according to one embodiment of the present invention can be variously applied to high resolution TVs, transparent displays, micro displays, and the like, each pixel can be programmed to adjust a critical voltage before a product is shipped, and the critical voltage can be adjusted in each pixel, thereby very effectively removing the mura phenomenon compared to the conventional critical voltage adjustment method using the conventional compensation circuit.

The present invention can provide a pixel circuit using a programmable driving TFT or programmable storage capacitor using a ferroelectric instead of a compensation circuit for compensating a critical voltage of the conventional current drive-based display circuit.

In addition, according to the present invention, since a large size of a compensation circuit is reduced into a size of a unit element, an aperture ratio can increase, thereby improving resolution/transparency and obtaining ease of integration.

In addition, the present invention uses HZO, which may be deposited in a large area, as a ferroelectric, and HZO is a CMOS-friendly material unlike the conventional ferroelectric, and thus an increase in cost of a method of manufacturing a current drive-based display circuit using HZO can be minimized.

While the present invention has been described with reference to specific details and limited embodiments such as specific components, these are provided only to facilitate overall understanding of the invention, and the invention is not limited thereto and may be variously modified and changed from the descriptions by those skilled in the art. Therefore, the spirit of the invention is defined not by the detailed description of the invention but by the appended claims, and encompasses all modifications and equivalents that fall within the scope of the appended claims.

What is claimed is:

1. A pixel circuit including a light-emitting diode, comprising:
   a switching transistor connected to a node at which a scan line and a signal line intersect each other;
   a driving transistor which receives a data voltage in the signal line through the switching transistor and converts the data voltage to a current to be supplied to the light-emitting diode, wherein the driving transistor includes a driving transistor insulating layer comprising a first ferroelectric layer formed as a first programmable polycrystalline; and a storage capacitor which maintains a voltage applied by the switching transistor, wherein the storage capacitor includes a storage capacitor insulating layer comprising a second ferroelectric layer formed as a second programmable polycrystalline.

2. The pixel circuit of claim 1, wherein at least one of the first ferroelectric layer or the second ferroelectric layer includes hafnium-zirconium oxide.

3. The pixel circuit of claim 1, wherein the driving transistor includes a single gate transistor and the driving transistor insulating layer is between a gate electrode and a channel layer of the driving transistor.

4. The pixel circuit of claim 1, wherein the driving transistor includes a double gate transistor.

5. The pixel circuit of claim 1, wherein:
a source of the switching transistor is connected to the signal line;
a gate of the switching transistor is connected to the scan line; and
a drain of the switching transistor and a first end of the storage capacitor are connected to a gate of the driving transistor.

6. The pixel circuit of claim 5, wherein a second end of the storage capacitor is connected to a ground source.

7. A display device comprising a pixel circuit including a light-emitting diode, wherein:
the pixel circuit includes a switching transistor connected to a node at which a scan line and a signal line intersect each other;
a driving transistor which receives a data voltage in the signal line through the switching transistor and converts the data voltage to a current to be supplied to the light-emitting diode, wherein the driving transistor includes a driving transistor insulating layer comprising a first ferroelectric layer formed as a first programmable polycrystalline; and
a storage capacitor which maintains a voltage applied by the switching transistor, wherein the storage capacitor includes a storage capacitor insulating layer comprising a second ferroelectric layer formed as a second programmable polycrystalline.

8. The display device of claim 7, wherein at least one of the first ferroelectric layer or the second ferroelectric layer includes hafnium-zirconium oxide.

9. The display device of claim 7, wherein the driving transistor includes a single gate transistor and the driving transistor insulating layer is between a gate electrode and a channel layer of the driving transistor.

10. The display device of claim 7, wherein the driving transistor includes a double gate transistor.

11. The display device of claim 7, wherein:
a source of the switching transistor is connected to the signal line;
a gate of the switching transistor is connected to the scan line; and
a drain of the switching transistor and a first end of the storage capacitor are connected to a gate of the driving transistor.

12. The display device of claim 11, wherein the other a second end of the storage capacitor is connected to a ground source.

13. A method of manufacturing a display device, comprising:
preparing a substrate;
forming a first thin film transistor (TFT), a second TFT, and a storage electrode on the substrate, wherein the second TFT includes a TFT insulating layer comprising a first ferroelectric layer formed as a first programmable polycrystalline;
forming a metal bus on the second TFT and the storage electrode, and dividing the metal bus to form a first metal bus and a second metal bus;
forming a second ferroelectric layer on the second metal bus to form a storage capacitor in which the storage electrode serves as one electrode and the second ferroelectric layer serves as a dielectric material layer, wherein the second ferroelectric layer is formed as a second programmable polycrystalline; and
forming a light-emitting element including a light-emitting layer on the first metal bus.

14. The method of claim 13, wherein the second ferroelectric layer is disposed above the first TFT and the second TFT.

15. The method of claim 13, wherein the second TFT includes a single gate transistor as a driving transistor.

16. The method of claim 13, wherein the second TFT includes a double gate transistor as a driving transistor.

* * * * *